(12) United States Patent
Chou et al.

(10) Patent No.: US 11,848,318 B2
(45) Date of Patent: Dec. 19, 2023

(54) PACKAGE STRUCTURE AND MANUFACTURING METHOD THEREOF

(71) Applicant: POWERTECH TECHNOLOGY INC., Hsinchu County (TW)

(72) Inventors: Pei-Hsun Chou, Hsinchu County (TW); Ko-Lun Liao, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 189 days.

(21) Appl. No.: 17/407,174

(22) Filed: Aug. 19, 2021

(65) Prior Publication Data
US 2022/0320063 A1    Oct. 6, 2022

(30) Foreign Application Priority Data
Mar. 30, 2021    (TW) .................. 110111436

(51) Int. Cl.
*H01L 25/18* (2023.01)
*H01L 23/31* (2006.01)
*H01L 21/56* (2006.01)
*H01L 23/00* (2006.01)

(52) U.S. Cl.
CPC ............ *H01L 25/18* (2013.01); *H01L 21/561* (2013.01); *H01L 23/3128* (2013.01); *H01L 23/3135* (2013.01); *H01L 24/32* (2013.01); H01L 2224/32145 (2013.01); H01L 2224/32225 (2013.01)

(58) Field of Classification Search
CPC ........ H10B 80/00; H10K 19/00; H10K 19/80; H01L 25/18; H01L 23/3128; H01L 23/3135; H01L 24/32
See application file for complete search history.

(56) References Cited

U.S. PATENT DOCUMENTS

2016/0172292 A1*  6/2016  Hsu .................. H01L 23/49833
                                                           257/698
2016/0343687 A1*  11/2016 Vadhavkar .......... H01L 23/3675

FOREIGN PATENT DOCUMENTS

| TW | 201603235 A | 1/2016 |
| TW | 201913933 A | 4/2019 |
| TW | I711131 B | 11/2020 |

* cited by examiner

*Primary Examiner* — Jasmine J Clark
(74) *Attorney, Agent, or Firm* — Winston Hsu

(57) ABSTRACT

A package structure and a manufacturing thereof are provided. The package structure includes a base, a chip, a control element and an underfill. The chip is disposed on the base and includes a recess, and the recess has a bottom surface and a sidewall. The control element is disposed between the base and the chip and disposed on the bottom surface of the recess, and a gap exists between the control element and the sidewall of the recess. The underfill is disposed in the recess. The chip and the control element are electrically connected to the base respectively.

14 Claims, 5 Drawing Sheets

PACKAGE STRUCTURE AND MANUFACTURING METHOD THEREOF

BACKGROUND OF THE INVENTION

1. Field of the Invention

The present invention relates to a package structure and a manufacturing method thereof, and more particularly to a package structure including a recess and a manufacturing method thereof.

2. Description of the Prior Art

In recent years, due to the miniaturization and high density of electronic elements in electronic devices, the packaging technology of hybrid packages that integrates multiple electronic elements or integrated circuits has been developed.

Currently, in the manufacturing process of the hybrid package, the electronic elements are usually supported by disposing several spacers to increase the structural stability of the overall package. However, since setting and attaching spacers are required in this method, the number of process stations (for example, the die attach process) is increased, which leads to more time consumption during the process and higher material cost. In addition, with the increase of the process stations, the probability of the producing process problems increases.

SUMMARY OF THE INVENTION

One of the objectives of the present invention is to provide a package structure and a manufacturing method thereof to simplify the manufacturing process, improve the production efficiency and reduce the manufacturing cost. Meanwhile, the production of process problems can be reduced, and the heat dissipation effect of elements can be improved.

According to an embodiment, the present invention provides a package structure. The package structure includes a base, a chip, a control element, and an underfill. The chip is disposed on the base. The chip includes a recess, and the recess has a bottom surface and a sidewall. The control element is disposed between the base and the chip and disposed on the bottom surface of the recess, and a gap exists between the control element and the sidewall of the recess. The underfill is disposed in the recess. The chip and the control element are electrically connected to the base respectively.

According to an embodiment, the present invention provides a manufacturing method of a package structure. The manufacturing method includes the following steps: forming a plurality of trenches on a wafer; attaching a plurality of control elements to a bottom surface of a corresponding one of the trenches respectively, wherein a gap exists between each of the control elements and a sidewall of the corresponding one of the trenches; performing a sawing process to the wafer to form a plurality of package units, wherein each of the package units comprises a chip and one of the control elements, wherein the chip comprises a recess, and the recess is a portion of one of the trenches; disposing one of the package units on a base, wherein the control element of the package unit is positioned between the base and the chip of the package unit; and filling an underfill in the recess.

In the package structure and the manufacturing method thereof of the present invention, by disposing the control element in the recess of the chip and disposing the chip together with the control element on the base, the stability of the package structure can be increased, and the advantages of simplifying the manufacturing process, improving the production efficiency, and reducing the manufacturing cost can be achieved, and the production of process problems can be further reduced. Furthermore, by disposing the control element in the recess of the chip first and then disposing the chip together with the control element on the base, the control element can be protected to avoid damage caused by external force when being disposed on the base. In addition, by making a gap exist between the control element and the chip and filling the underfill, the heat dissipation effect of the elements can be improved. Filling the underfill in the recess can further avoid gas from remaining inside the structure, thereby improving the mechanical strength and reliability of the structure.

These and other objectives of the present invention will no doubt become obvious to those of ordinary skill in the art after reading the following detailed description of the preferred embodiment that is illustrated in the various figures and drawings.

DETAILED DESCRIPTION

The present invention may be understood by reference to the following detailed description, taken in conjunction with the drawings as described below. It is noted that, for purposes of illustrative clarity and being easily understood by the readers, various drawings of this invention show at least a portion of the package structure or at least a portion of the steps of manufacturing the package structure, and certain elements in various drawings may not be drawn to scale. In addition, the number and dimension of each element shown in drawings are only illustrative and are not intended to limit the scope of the present invention.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". When the terms "include", "comprise" and/or "have" are used in the description of the present invention, the corresponding features, regions, steps, operations and/or components would be pointed to existence, but not limited to the existence or addition of one or more corresponding features, regions, steps, operations and/or components.

It should be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present invention.

FIG. 1A, FIG. 1B, and FIG. 2 to FIG. 5 are process schematic diagrams of a manufacturing method of a package structure according to an embodiment of the present invention. The manufacturing method of a package structure 100 according to an embodiment of the present invention will be described below with reference to FIG. 1A, FIG. 1B, and FIG. 2 to FIG. 5, but not limited herein. In some embodiments, step(s) may be added or deleted according to requirements.

Figure 1A:
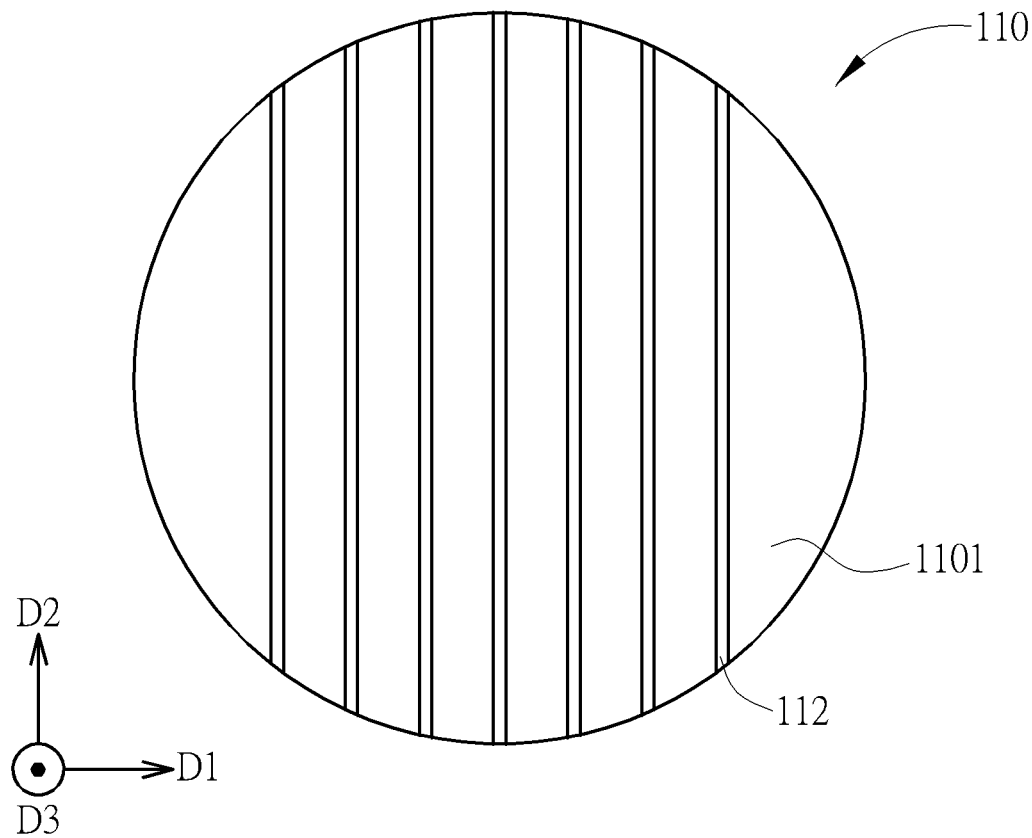
FIG. 1A, FIG. 1B, and FIG. 2 to FIG. 5 are process schematic diagrams of a manufacturing method of a package structure according to an embodiment of the present invention.
Figure 1B:
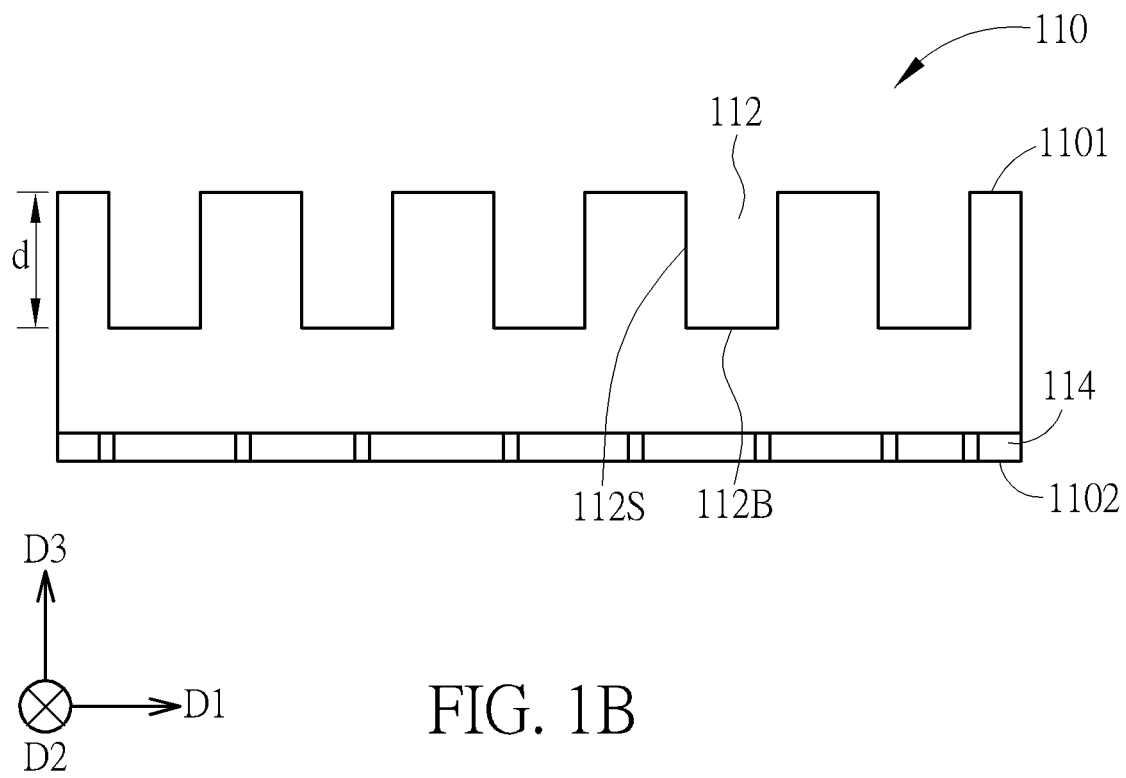

As shown in FIG. 1A and FIG. 1B, first, a wafer 110 is provided, and a plurality of trenches 112 are formed on the surface of the wafer 110, wherein FIG. 1A is a top view schematic diagram of the wafer 110, and FIG. 1B is a partial side view schematic diagram of the wafer 110. The plurality of trenches 112 may be formed on the wafer 110 by an etching process, photolithography process, laser process or other suitable processes. The wafer 110 may include a first surface 1101 and a second surface 1102 which are positioned on two opposite sides, and the second surface 1102 is a surface disposed with an active layer 114. The active layer 114 may include, for example, wires and/or connecting elements, but not limited herein. According to the present invention, the plurality of trenches 112 may be formed on the first surface 1101 (e.g., the backside of the wafer 110) opposite to the second surface 1102, wherein the plurality of trenches 112 may be arranged with intervals along a first direction D1, each of the trenches 112 may extend along a second direction D2 on the first surface 1101 of the wafer 110, and each of the trenches 112 may have a depth d in a third direction D3 perpendicular to the first surface 1101. In some embodiments, the first direction D1, the second direction D2 and the third direction D3 may be perpendicular to each other, but not limited herein. As shown in FIG. 1B, each of the trenches 112 respectively has a bottom surface 112B and a sidewall 112S.

Figure 2:
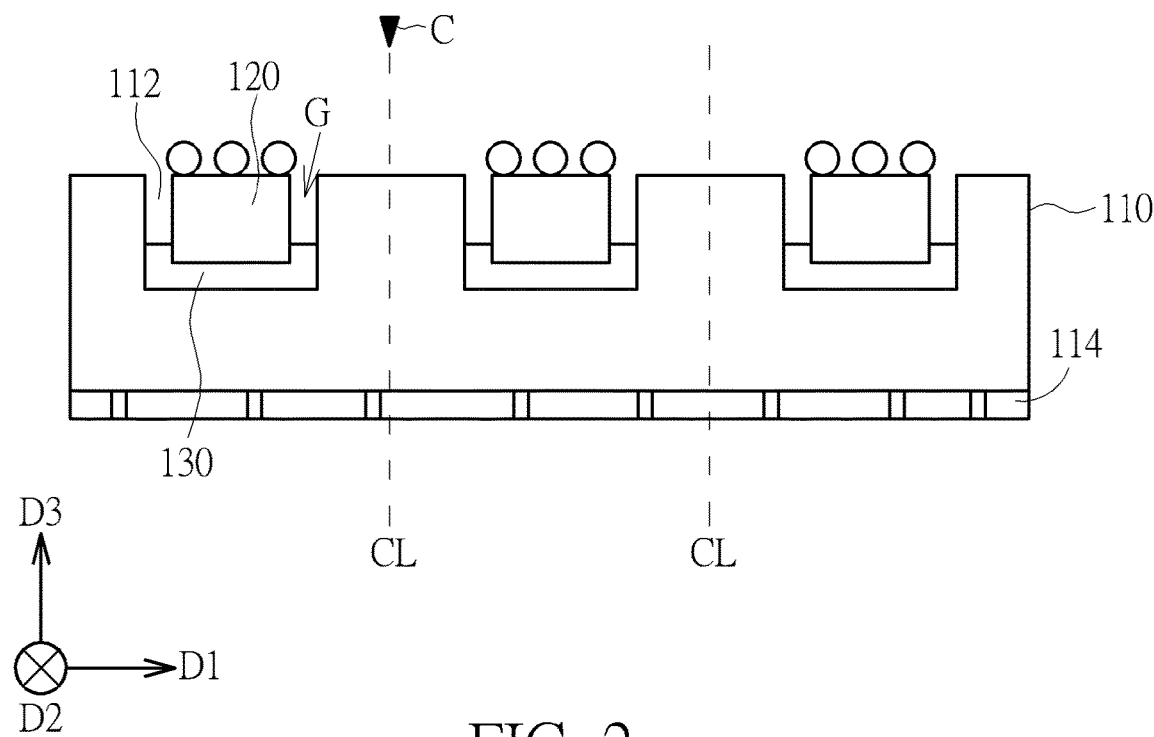

Then, as shown in FIG. 2, a plurality of control elements 120 are respectively attached to the bottom surface 112B of a corresponding one of the trenches 112, and a gap G exists between each of the control elements 120 and the sidewall 112S of the corresponding one of the trenches 112. For example, in one trench 112, the plurality of control elements 120 may be attached to the bottom surface 112B of the trench 112 with intervals along the first direction D1 and the second direction D2. These control elements 120 can be arranged in an array along the first direction D1 and the second direction D2 in the trench 112 for example, that is, the control elements 120 may be accommodated in one trench 112, but not limited herein. In this embodiment, each of the control elements 120 may be attached to the bottom surface 112B of the corresponding one of the trenches 112 through an adhesive layer 130. The adhesive layer 130 may be, for example, a thermosetting polymer adhesive, a die attach film (DAF) or other suitable materials, but not limited herein. The adhesive layer 130 is a thermosetting polymer adhesive 130a as an example in this embodiment. In the step of attaching the control elements 120 to the bottom surface 112B of a corresponding one of the trenches 112 respectively, the thermosetting polymer adhesive 130a may be formed between the bottom surface 112B of the trench 112 and the control element 120 first, and then the thermosetting polymer adhesive 130a is cured by air drying or heat hardening, so that the control element 120 is attached and fixed to the bottom surface 112B of the trench 112 through the thermosetting polymer adhesive 130a, but not limited herein.

Figure 3:
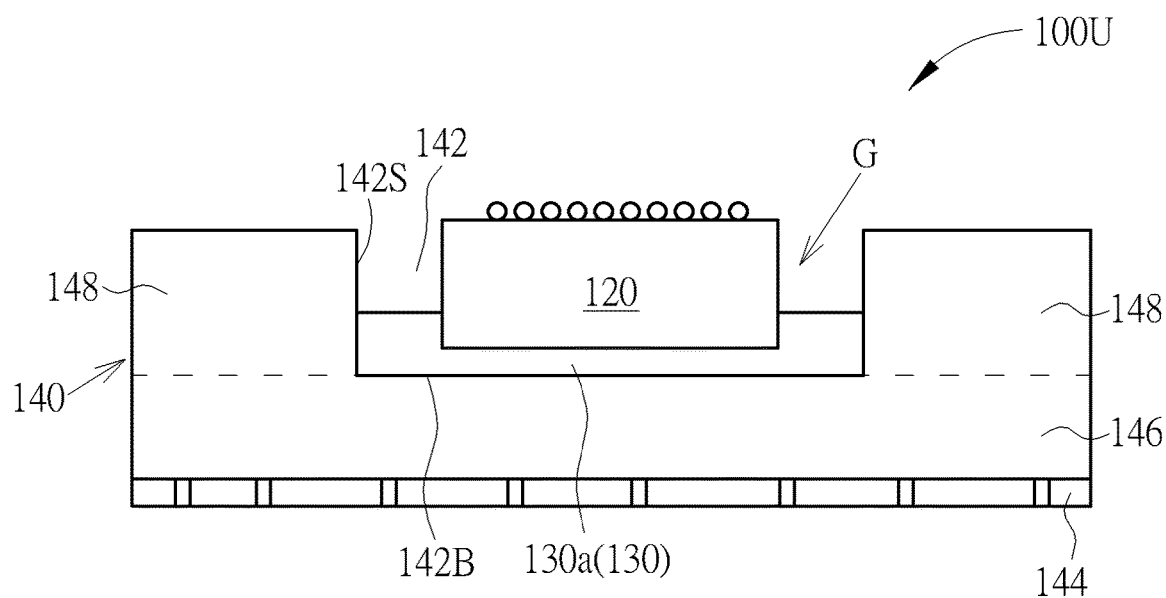

Then, as shown in FIG. 2 and FIG. 3, a sawing process C is performed to the wafer 110 to form a plurality of package units 100U. Each of the package units 100U includes a chip 140 and one of the control elements 120. The chip 140 includes a recess 142, and the recess 142 is a portion of one of the trenches 112. For example, the sawing process C may be performed along a plurality of sawing lines CL to form the plurality of package units 100U, and the sawing process C is exemplified by, but not limited to, a mechanical sawing process, a laser sawing process or other suitable sawing processes. As shown in FIG. 3, the package unit 100U includes the chip 140 and the control element 120, and the chip 140 may be a portion of the wafer 110 and include an active layer 144, wherein active layer 144 may be a portion of the active layer 114 of the wafer 110. The chip 140 further includes a body part 146 and two protrusion parts 148, and the two protrusion parts 148 respectively extend from two sides of the body part 146 to define the recess 142. Therefore, the sidewall 142S of the recess 142 is also the sidewall of the protrusion parts 148.

Figure 4:
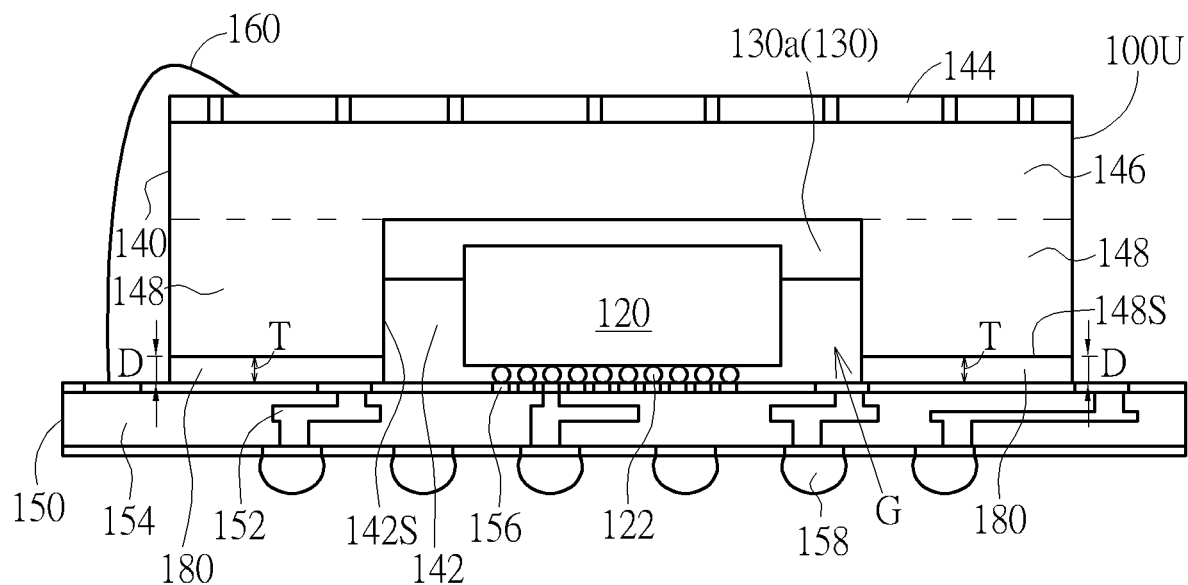

Then, as shown in FIG. 4, one of the package units 100U is disposed on a base 150, and the control element 120 of the package unit 100U is positioned between the base 150 and the chip 140 of the package unit 100U. The package unit 100U including the chip 140 and the control element 120 is turned upside down on the base 150 as a whole, that is, the opening of the recess 142 of the chip 140 is disposed downward, so that the control element 120 is positioned between the base 150 and the chip 140. This design may protect the control element 120 from being damaged due to external force during disposing. The base 150 may be any base that can be used to carry or dispose electronic elements. For example, the base 150 may include a metal layer 152, an insulating layer 154, and conductive pads 156. The metal layer 152 and the conductive pads 156 may respectively include, for example, aluminum, copper, tin, nickel, gold, silver, other suitable conductive materials, or combinations of the above materials. The insulating layer 154 may include, for example, silicon dioxide, silicon nitride, silicon oxynitride, tantalum pentoxide, aluminum oxide, epoxy, or other suitable insulating materials, but the present invention is not limited to the above materials. The metal layer 152 and the insulating layer 154 may form a redistribution layer (RDL) to redistribute the circuits, but not limited herein. In other embodiments, the base 150 may be a substrate including silicon, ceramic, plastic and other materials, a flexible substrate, a conductive substrate, a lead frame, a copper foil substrate or other suitable substrates, but not limited herein. In addition, the bottom of the base 150 may further include a plurality of conductive terminals 158 electrically connected to the metal layer 152. The conductive terminals 158 may be solder balls or bumps, and may include copper, tin, nickel, gold, lead or other suitable conductive materials, but not limited herein. In this embodiment, the package unit 100U may be, for example, disposed on the base 150 by the flip chip process, so that the control element 120 and the chip 140 may be electrically connected to the base 150 respectively. For example, solder balls 122 may be formed on the bottom of the control element 120 and then disposed on the base 150 through the flip chip process, so as to make the solder balls 122 be electrically connected to the conductive pads 156 of the base 150, and the chip 140 may be electrically connected to the base 150 by the wire bonding process, such as making the chip 140 be electrically connected to the base 150 through a wire 160, but not limited herein In some embodiments, as shown in FIG. 4, the step of disposing one of the package units 100U on the base 150 further includes attaching the chip 140 to the base 150 through a die attach film 180, that is, the chip 140 is attached to the base 150 through the die attach film 180 to achieve disposing the package units 100U on the base 150. In detail, the die attach films 180 may be correspondingly disposed on the surface 148S of each of the protrusion parts 148 respectively, and then the package unit 100U is attached to the base 150, so that the die attach film 180 is disposed between each of the protrusion parts 148 of the chip 140 and the base 150, but not limited herein. After the package unit 100U is disposed on the base 150, a distance D exists between the outer side of the chip 140 and the base 150. Particularly, the distance D exists between the surface 148S of each of the protrusion parts 148 and the base 150, and each of the distance D ranges from 20 micrometers to 120 micrometers, but not limited herein. Furthermore, a thickness T of the die attach film 180 is equal to the distance D between the surface 148S of each of the protrusion parts 148 and the base 150 (i.e., the thickness T=the distance D). In addition, the distance D and/or the thickness T should not be too large or too small. If the distance D and/or thickness T is too large, the overall thickness of the structure will increase, and the structure will be unstable due to the large distance between the chip 140 and the base 150. If the distance D and/or the thickness T is too small, the adhesion between the chip 140 and the base 150 will be unstable, and the structure will be unstable. Therefore, the thickness T of the die attach film 180 preferably ranges from 20 micrometers to 120 micrometers, thereby making the structure of the package unit 100U disposed on the base 150 more stable.

Figure 5:
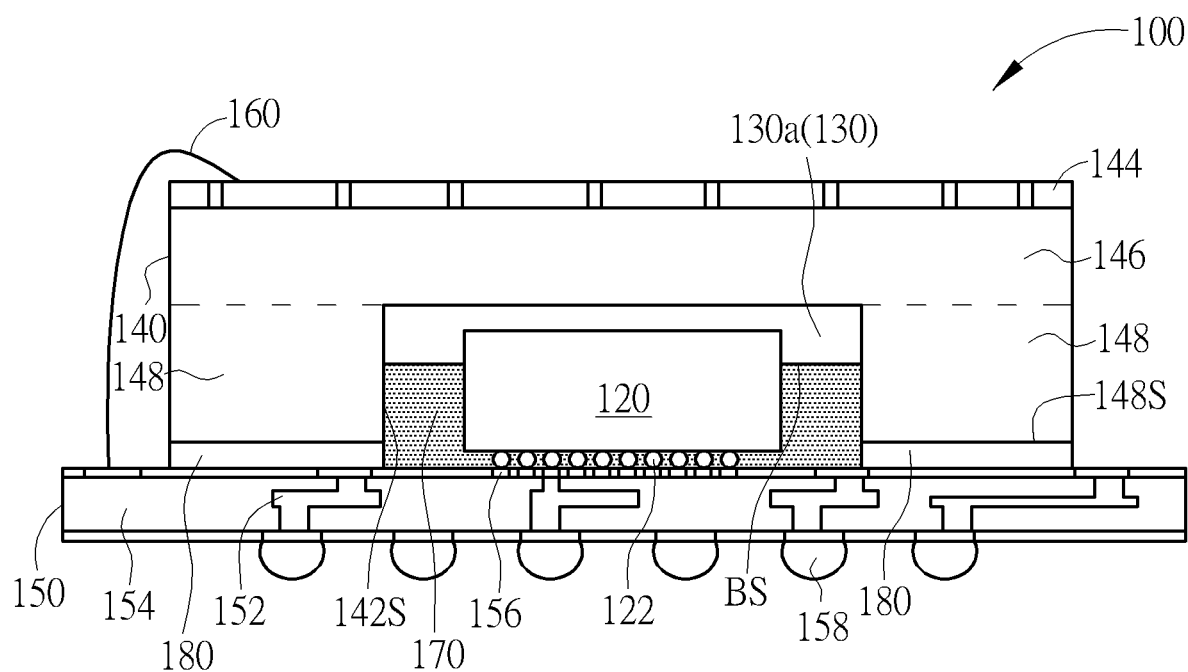

Then, as shown in FIG. 5, an underfill 170 is filled in the recess 142 to avoid gas from remaining inside the structure, thereby improving the mechanical strength and reliability of the structure, wherein the underfill 170 may include epoxy resin or other suitable materials, but not limited herein. After the package unit 100U is disposed on the base 150, a gap still exists between the control element 120 and the base 150, and a gap G also exists between the control element 120 and the sidewall 142S of the recess 142 (as shown in FIG. 4). Therefore, the underfill 170 may be disposed in the gap G and between the control element 120 and the base 150 to avoid gas from remaining inside the structure. In this embodiment, the adhesive layer 130 and the underfill 170 include different materials, so an interface BS (as shown in FIG. 5) may be formed between the adhesive layer 130 and the underfill 170, but not limited herein. In some embodiments, the underfill 170 may include heat dissipation materials, and the heat dissipation effect of the elements can be improved by leaving a gap G between the control element 120 and the side wall 142S of the recess 142, and then filling the gap G with the underfill 170 which is helpful for heat dissipation, but not limited herein. In addition, the underfill 170 may further have a low coefficient of thermal expansion (CTE) to reduce the occurrence of warpage in the structure, but not limited herein.

In other words, a package structure is manufactured by the manufacturing method as described above, and the package structure 100 according to an embodiment of the present invention may include a base 150, a chip 140, a control element 120 and an underfill 170. The chip 140 is disposed on the base 150. The chip 140 includes a recess 142, and the recess 142 has a bottom surface 142B and a sidewall 142S. The control element 120 is disposed between the base 150 and the chip 140 and disposed on the bottom surface 142B of the recess 142, and a gap G exists between the control element 120 and the sidewall 142S of the recess 142. The underfill 170 is disposed in the recess 142. The chip 140 and the control element 120 are electrically connected to the base 150 respectively. In some embodiments, the chip 140 further includes a body part 146 and two protrusion parts 148, and the two protrusion parts 148 respectively extend from two sides of the body part 146 to define the recess 142. In some embodiments, a die attach film 180 is further disposed between each of the protrusion parts 148 and the base 150 for attaching the chip 140 to the base 150. In some embodiment, a distance D further exists between a surface 148S of each of the protrusion parts 148 and the base 150, and each of the distance D ranges from 20 micrometers to 120 micrometers. In some embodiments, the package structure 100 further includes an adhesive layer 130 disposed between the control element 120 and the chip 140 for attaching the control element 120 to the bottom surface 142B of the recess 142. In some embodiments, the underfill 170 is disposed in the gap G and between the control element 120 and the base 150.

Through the disposing of elements and the structural design of the package structure 100 and the manufacturing method thereof in the embodiments described above, the stability of the package structure 100 can be increased, and there is no need to dispose additional supporting structures or supporting materials, so that the number of the process stations can be reduced, thereby achieving the advantages of simplifying the manufacturing process, improving the production efficiency, and reducing the manufacturing cost. In addition, since the number of the process stations is reduced and the manufacturing process is simplified, the production of process problems can be further reduced.

Figure 6:
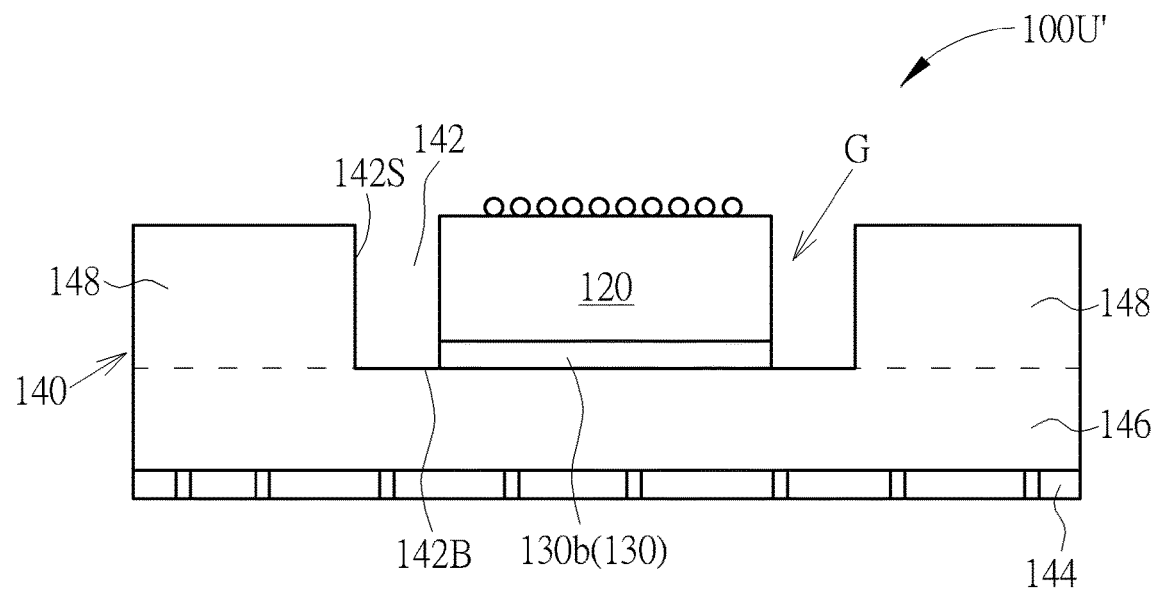
FIG. 6 is a cross-sectional view schematic diagram of a package unit according to a variation embodiment of the present invention.

FIG. 6 is a cross-sectional view schematic diagram of a package unit 100U' according to a variation embodiment of the present invention. As shown in FIG. 6, in the package unit 100U', the control element 120 is attached to the bottom surface 142B of the recess 142 through a die attach film 130b, that is, the thermosetting polymer adhesive 130a is replaced by the die attach film 130b. Particularly, in the step of attaching the control element 120 to the bottom surface 112B of the trench 112 before sawing the wafer 110 as shown in FIG. 1A, one side of the die attach film 130b may be attached to the control element 120 first, and then the other side of the die attach film 130b may be attached to the wafer 110, so that the control element 120 can be attached to the bottom surface 112B of the trench 112 through the die attach film 130b, but not limited herein.

Figure 7:
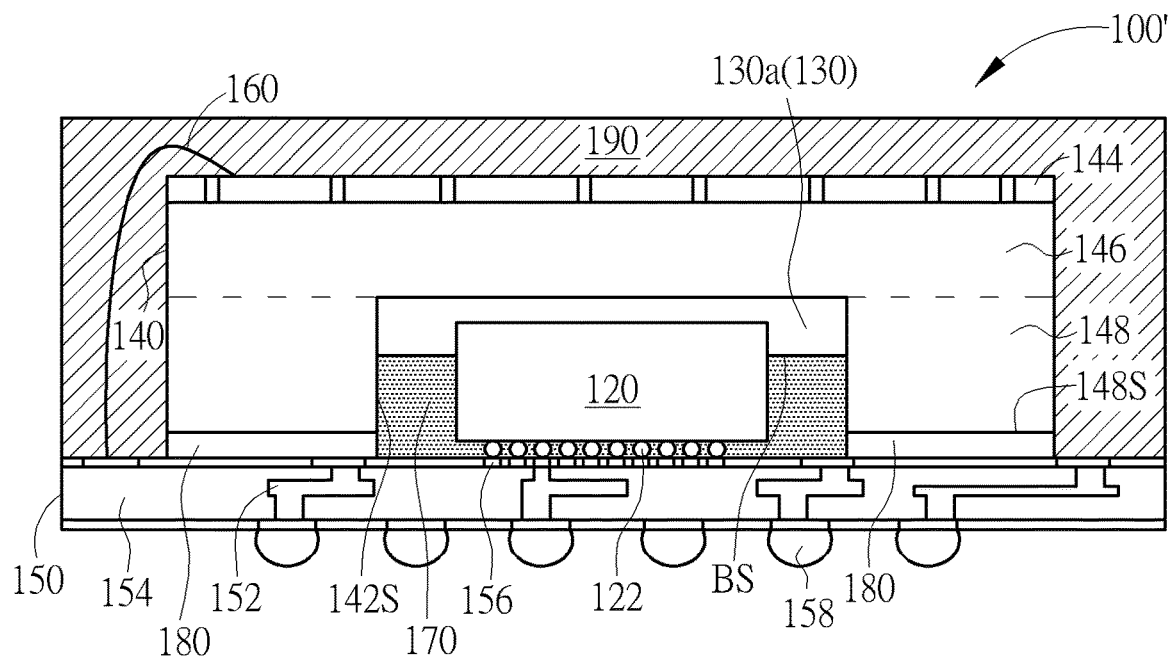
FIG. 7 is a cross-sectional view schematic diagram of a package structure according to another embodiment of the present invention.

FIG. 7 is a cross-sectional view schematic diagram of a package structure according to another embodiment of the present invention. As shown in FIG. 1A, FIG. 1B, FIG. 2 to FIG. 5, and FIG. 7, in some embodiments, after the recess 142 is filled with the underfill 170, a molding process may be performed to form an encapsulant material 190 on the base 150 to cover the chip 140 and the base 150, thereby forming an package structure 100' according to another embodiment of the present invention. That is to say, compared with the package structure 100 of the previous embodiment, the package structure 100' of this embodiment further includes an encapsulant material 190 disposed on the base 150 and covering the chip 140 and the base 150. The encapsulant material 190 may be, for example, an epoxy molding compound (EMC), or the encapsulant material 190 may include epoxy resin, ceramic powders, carbon black, other suitable materials or combinations of the above materials, but not limited herein. Through forming the encapsulant material 190 to cover the chip 140 and the base 150, the elements can be avoid being polluted by foreign substances and affecting their functions.

Figure 8:
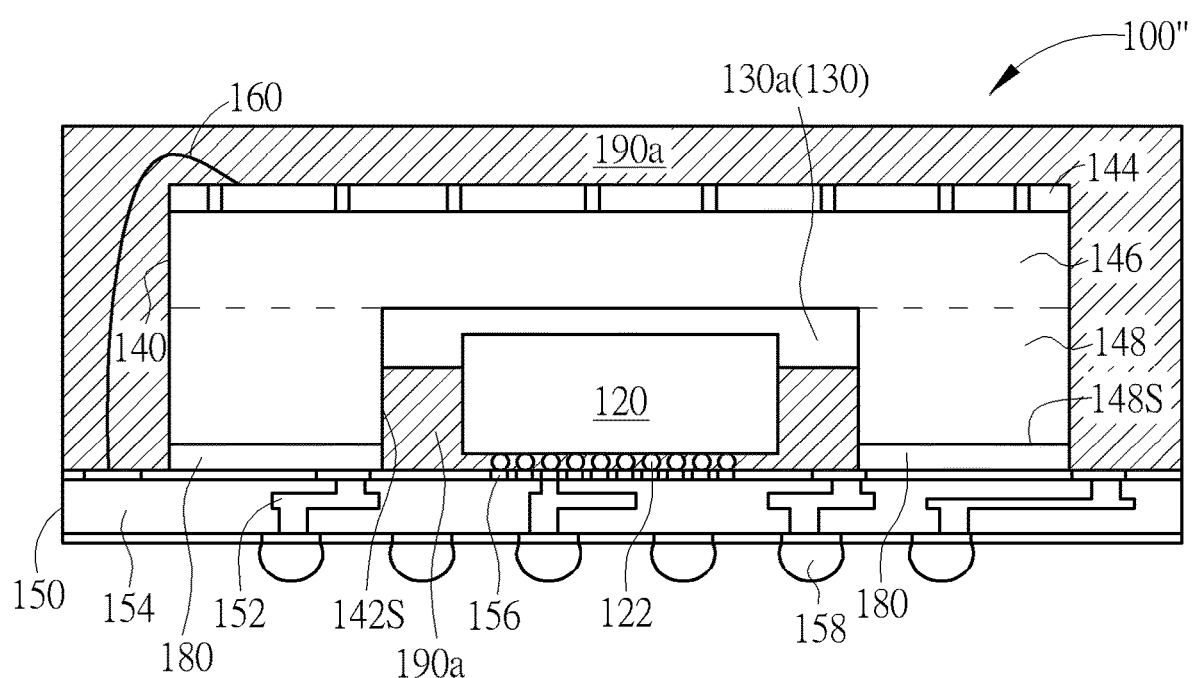
FIG. 8 is a process schematic diagram of a manufacturing method of a package structure according to another embodiment of the present invention.

FIG. 8 is a process schematic diagram of a manufacturing method of a package structure according to another embodiment of the present invention. As shown in FIG. 8 and cooperated with FIG. 1A, FIG. 1B, and FIG. 2 to FIG. 4, in this embodiment, after the chip 140 is attached to the base 150 through the die attach films 180 to make the package unit 100U be disposed on the base 150, a molding process is performed to form an encapsulant material 190a on the base 150 to cover the chip 140 and the base 150, and the encapsulant material 190a may be filled in the gap G and the gap between the control element 120 and the base 150 through the recess 142, thereby forming a package structure 100" according to another embodiment of the present invention. The encapsulant material 190a may include epoxy resin, ceramic powders, carbon black, other suitable materials, or combinations of the above materials, and the average size of filling particles in the encapsulant material 190a is 0.6 micrometers, so that the encapsulant material 190a is able to be filled in the gap G and the gap between the control element 120 and the base 150 through the recess 142 during the molding process, but not limited herein. In a variation embodiment, the package unit 100U shown in FIG. 8 may also be replaced with the package unit 100U' shown in FIG. 6.

From the above description, in the package structure and the manufacturing method thereof of the present invention, by disposing the control element in the recess of the chip and disposing the chip together with the control element on the base, the stability of the package structure can be increased, and the advantages of simplifying the manufacturing process, improving the production efficiency, and reducing the manufacturing cost can be achieved, and the production of process problems can be further reduced. Furthermore, by disposing the control element in the recess of the chip first and then disposing the chip together with the control element on the base, the control element can be protected to avoid damage caused by external force when being disposed on the base. In addition, by making a gap exist between the control element and the chip and filling the underfill, the heat dissipation effect of the elements can be improved. Filling the underfill in the recess can further avoid gas from remaining inside the structure, thereby improving the mechanical strength and reliability of the structure.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A package structure, comprising:
   a base;
   a chip disposed on the base, wherein the chip comprises a recess, and the recess has a surface and a sidewall, wherein the surface faces the base, and the sidewall is connected to the surface and located between the surface and the base;
   a control element disposed between the base and the chip and disposed on the surface of the recess, wherein a gap exists between the control element and the sidewall of the recess; and
   an underfill disposed in the recess,
   wherein the chip and the control element are electrically connected to the base individually.

2. The package structure according to claim 1, wherein the chip further comprises a body part and two protrusion parts, and the two protrusion parts respectively extend from two sides of the body part to define the recess.

3. The package structure according to claim 2, wherein a die attach film is disposed between each of the protrusion parts and the base for attaching the chip to the base.

4. The package structure according to claim 2, wherein a distance exists between a surface of each of the protrusion parts and the base, and each of the distances ranges from 20 micrometers to 120 micrometers.

5. The package structure according to claim 1, further comprising an adhesive layer disposed between the control element and the chip for attaching the control element to the bottom surface of the recess.

6. The package structure according to claim 1, wherein the underfill is disposed in the gap and between the control element and the base.

7. The package structure according to claim 1, further comprising an encapsulant material disposed on the base and covering the chip and the base.

8. A manufacturing method of a package structure, comprising the following steps:
   forming a plurality of trenches on a wafer;
   attaching a plurality of control elements to a bottom surface of a corresponding one of the trenches respectively, wherein a gap exists between each of the control elements and a sidewall of the corresponding one of the trenches;
   performing a sawing process to the wafer to form a plurality of package units, wherein each of the package units comprises a chip and one of the control elements, wherein the chip comprises a recess, and the recess is a portion of one of the trenches;
   disposing one of the package units on a base, wherein the control element of the package unit is positioned between the base and the chip of the package unit; and
   filling in the recess with an underfill.

9. The manufacturing method of the package structure according to claim 8, wherein the step of disposing the one of the package units on the base comprises attaching the chip to the base through a die attach film.

10. The manufacturing method of the package structure according to claim 9, wherein a thickness of the die attach film ranges from 20 micrometers to 120 micrometers.

11. The manufacturing method of the package structure according to claim 8, wherein each of the control elements is attached to the bottom surface of the corresponding one of the trenches through an adhesive layer, and the adhesive layer and the underfill comprise different materials.

12. The manufacturing method of the package structure according to claim 11, wherein the adhesive layer is a thermosetting polymer adhesive or a die attach film.

13. The manufacturing method of the package structure according to claim 8, wherein the step of filling the recess with the underfill comprises disposing the underfill in the gap and between the control element and the base.

14. The manufacturing method of the package structure according to claim 8, further comprising forming an encapsulant material on the base to cover the chip and the base.

\* \* \* \* \*